(12) United States Patent
Kito

(10) Patent No.: US 8,830,757 B2
(45) Date of Patent: Sep. 9, 2014

(54) METHOD FOR OPERATING NONVOLATILE SEMICONDUCTOR MEMORY DEVICE

(75) Inventor: Masaru Kito, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 351 days.

(21) Appl. No.: 13/235,999

(22) Filed: Sep. 19, 2011

(65) Prior Publication Data

US 2012/0206961 A1  Aug. 16, 2012

(30) Foreign Application Priority Data

Feb. 10, 2011 (JP) .................................. 2011-026946

(51) Int. Cl.
*G11C 16/04* (2006.01)
*G11C 16/06* (2006.01)
*G11C 16/10* (2006.01)
G11C 16/34 (2006.01)

(52) U.S. Cl.
CPC ........ *G11C 16/0483* (2013.01); *G11C 16/3495* (2013.01); *G11C 16/06* (2013.01); *G11C 16/04* (2013.01); *G11C 16/10* (2013.01); *G11C 16/3404* (2013.01)
USPC .............. 365/185.2; 365/185.01; 365/185.09; 365/185.11; 365/185.17; 365/185.24

(58) Field of Classification Search
CPC .............. G11C 16/04; G11C 16/0408; G11C 16/0483; G11C 16/06; G11C 16/10; G11C 16/12; G11C 16/102; G11C 16/3495
USPC ............. 365/185.01, 185.09, 185.11, 185.17, 365/185.24, 185.2
See application file for complete search history.

(56) References Cited

U.S. PATENT DOCUMENTS

| 7,936,004 B2 | 5/2011 | Kito et al. |
| 2007/0189073 A1* | 8/2007 | Aritome .................. 365/185.18 |
| 2007/0252201 A1* | 11/2007 | Kito et al. ..................... 257/331 |
| 2010/0207195 A1 | 8/2010 | Fukuzumi et al. |

* cited by examiner

*Primary Examiner* — Tha-O H Bui
(74) *Attorney, Agent, or Firm* — Oblon, Spivak, McClelland, Maier & Neustadt, L.L.P.

(57) ABSTRACT

According to one embodiment, a method for operating a nonvolatile semiconductor memory device, the device includes a memory unit having a memory string, and a control unit. The memory string includes a plurality of transistors and has a first group being part of the transistors, a adjusting transistor connected next to the first group, and a second group including transistors connected to a side opposite the first group with respect to the adjusting transistor. The method includes rewriting the threshold values of the transistors of the first group, and then performing control so as to set a first threshold value for adjustment to the adjusting transistor to adjust an amount corresponding to relative variations in the threshold values of the transistors of the second group, the relative variations being caused by the rewrite of the threshold values of the transistors of the first group.

16 Claims, 13 Drawing Sheets

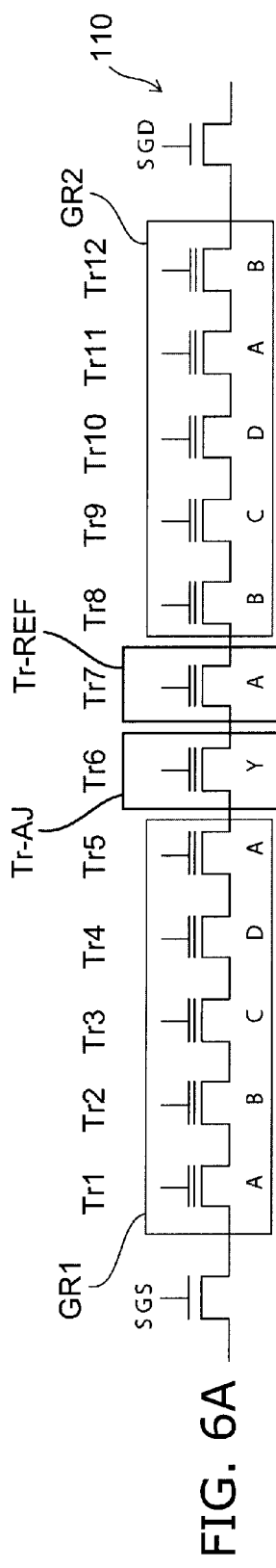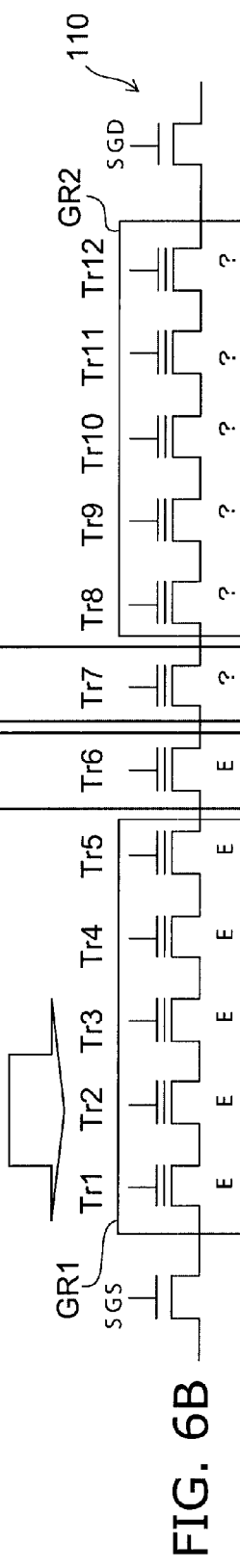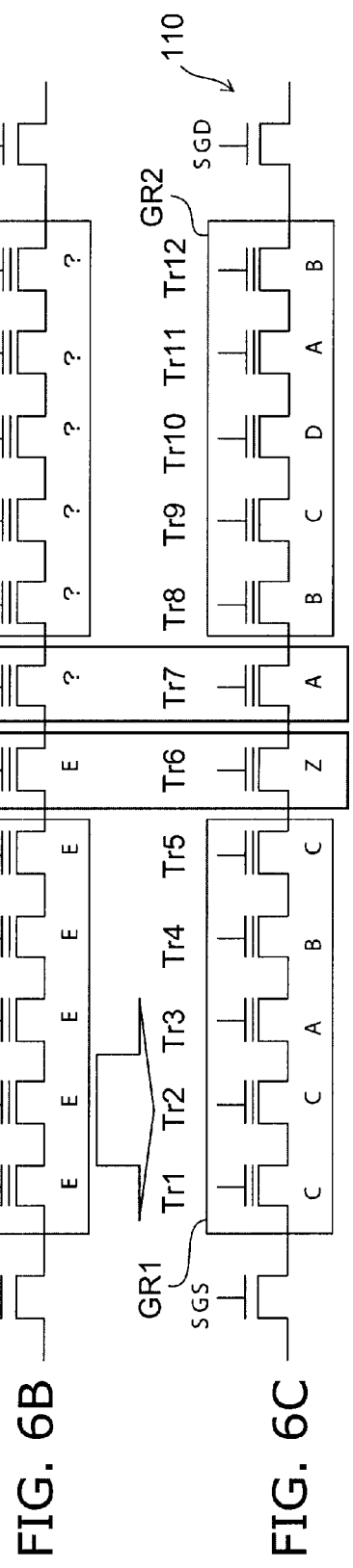
FIG. 6A
FIG. 6B
FIG. 6C

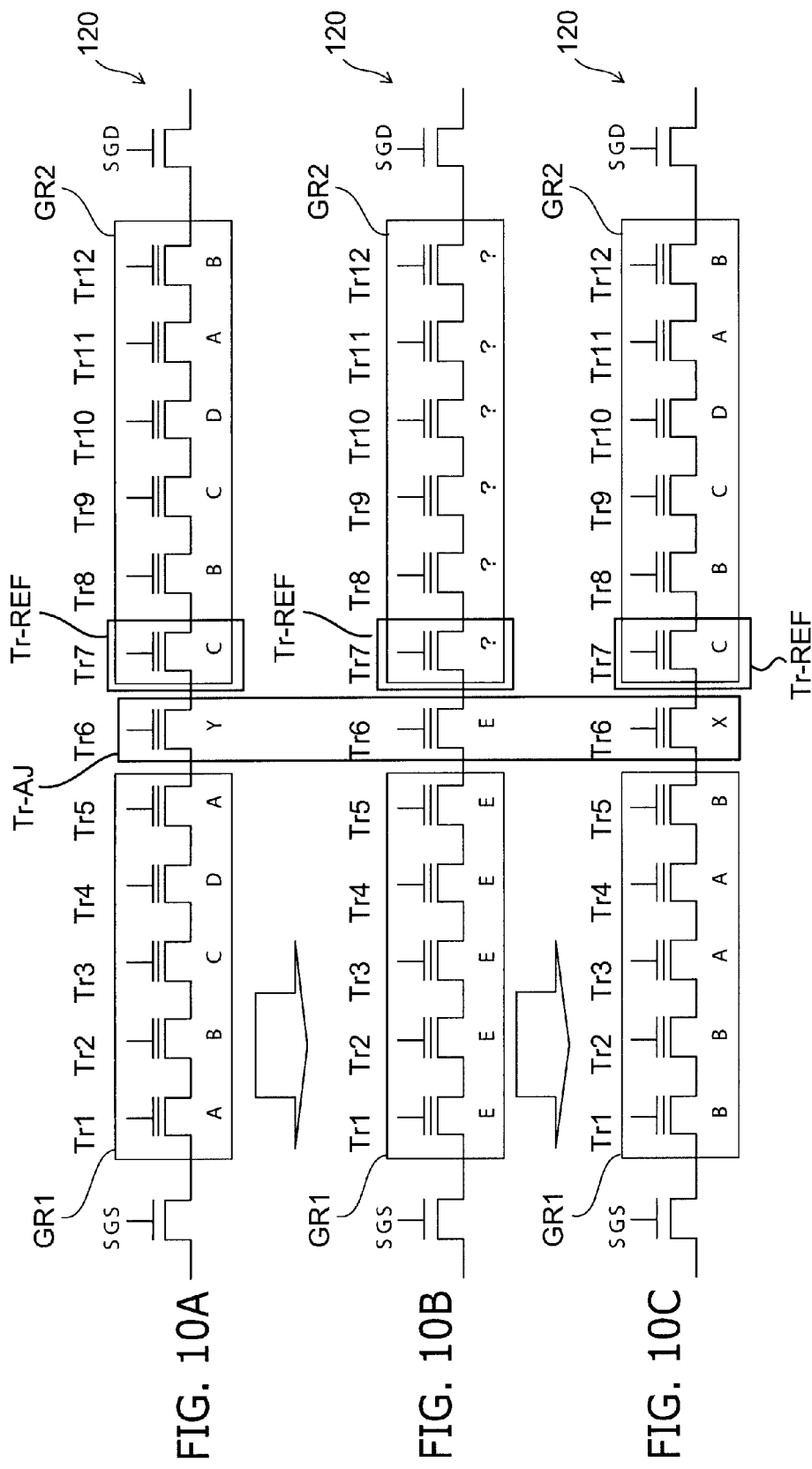

METHOD FOR OPERATING NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-026946, filed on Feb. 10, 2011; the entire contents of which are incorporated herein by reference.

FIELD

Embodiments described herein relate generally to a method for operating a nonvolatile semiconductor memory device.

BACKGROUND

In order to increase the memory capacity of a nonvolatile semiconductor memory device (memory), it is necessary to reduce the dimensions of one element. In order to solve difficulties in relation to cost and technology accompanying the miniaturization of elements, a collectively processed three-dimensional stacked memory cell is proposed.

In the collectively processed three-dimensional stacked memory cell, insulating layers and electrode films (functioning as word lines) are alternately stacked to form a stacked body, and through holes are formed collectively in the stacked body. Then, on the side surface of the through hole, a charge storage film (memory layer) is formed, and silicon is embedded inside the through hole to form a silicon pillar. Between the charge storage film and the silicon pillar, a tunnel insulating layer is provided and between the charge storage film and the electrode film, a block insulating layer is provided. In this manner, a memory cell including, for example, a MONOS (Metal Oxide Nitride Oxide Semiconductor) type transistor is formed at each of the intersection portions of the electrode films and the silicon pillars.

In a NAND flash memory, when data is newly rewritten, a certain region is collectively erased and new data is written. At this time, there is a case where it is preferable to reduce the size (block size) of the region (block) to be collectively erased. On the other hand, if the block size is reduced, one NAND string becomes small and the number of NAND strings increases, which induces an increase in a driver circuit (control unit). In a nonvolatile semiconductor memory device, it is desired to reduce the block size without inducing an increase in the control unit.

BRIEF DESCRIPTION OF THE DRAWINGS

FIG. 6A to 6C are diagrams for explaining a first embodiment.

FIG. 10A to 10C are diagrams for explaining a second embodiment.

DETAILED DESCRIPTION

In general, according to one embodiment, a method is disclosed for operating a nonvolatile semiconductor memory device. The nonvolatile semiconductor memory device includes a memory unit having a memory string and a control unit controlling the memory unit. The memory string includes a plurality of transistors connected in series and has a first group being part of the plurality of transistors, a first adjusting transistor connected next to the first group, and a second group including transistors connected to the first adjusting transistor on the side opposite to the first group. Threshold values set to the plurality of transistors, respectively, according to charges stored in a charge storage film. The method includes rewriting the threshold values of the transistors of the first group, and then performing control so as to set a first threshold value for adjustment to the first adjusting transistor to adjust an amount corresponding to relative variations in the threshold values of the transistors of the second group. The relative variations caused by the rewrite of the threshold values of the transistors of the first group.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

Figure 1:
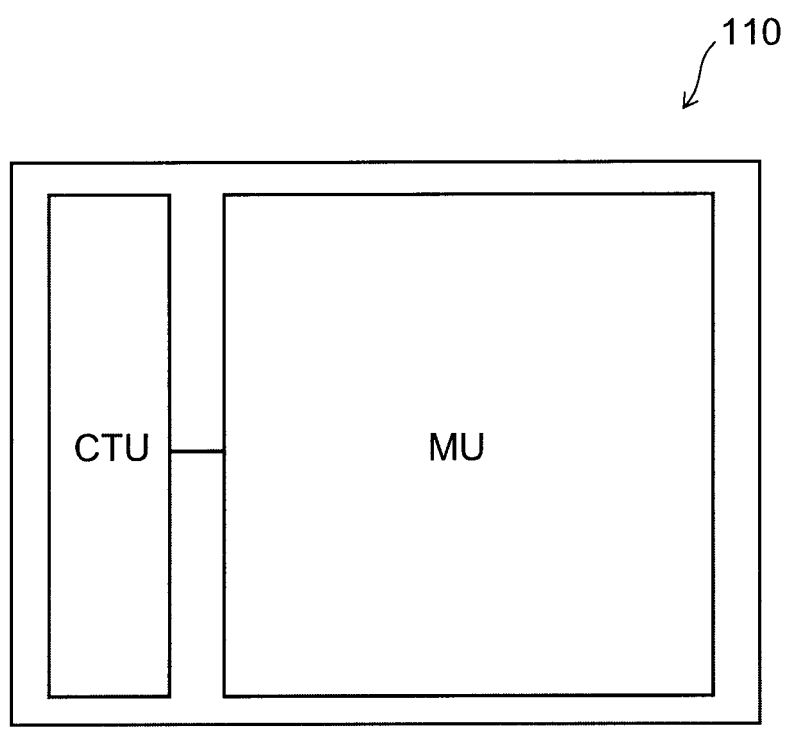
FIG. 1 is an outline block diagram illustrating a configuration of a nonvolatile semiconductor memory device according to the embodiment.

FIG. 1 is an outline block diagram illustrating a configuration of a nonvolatile semiconductor memory device according to an embodiment.

Figure 2:
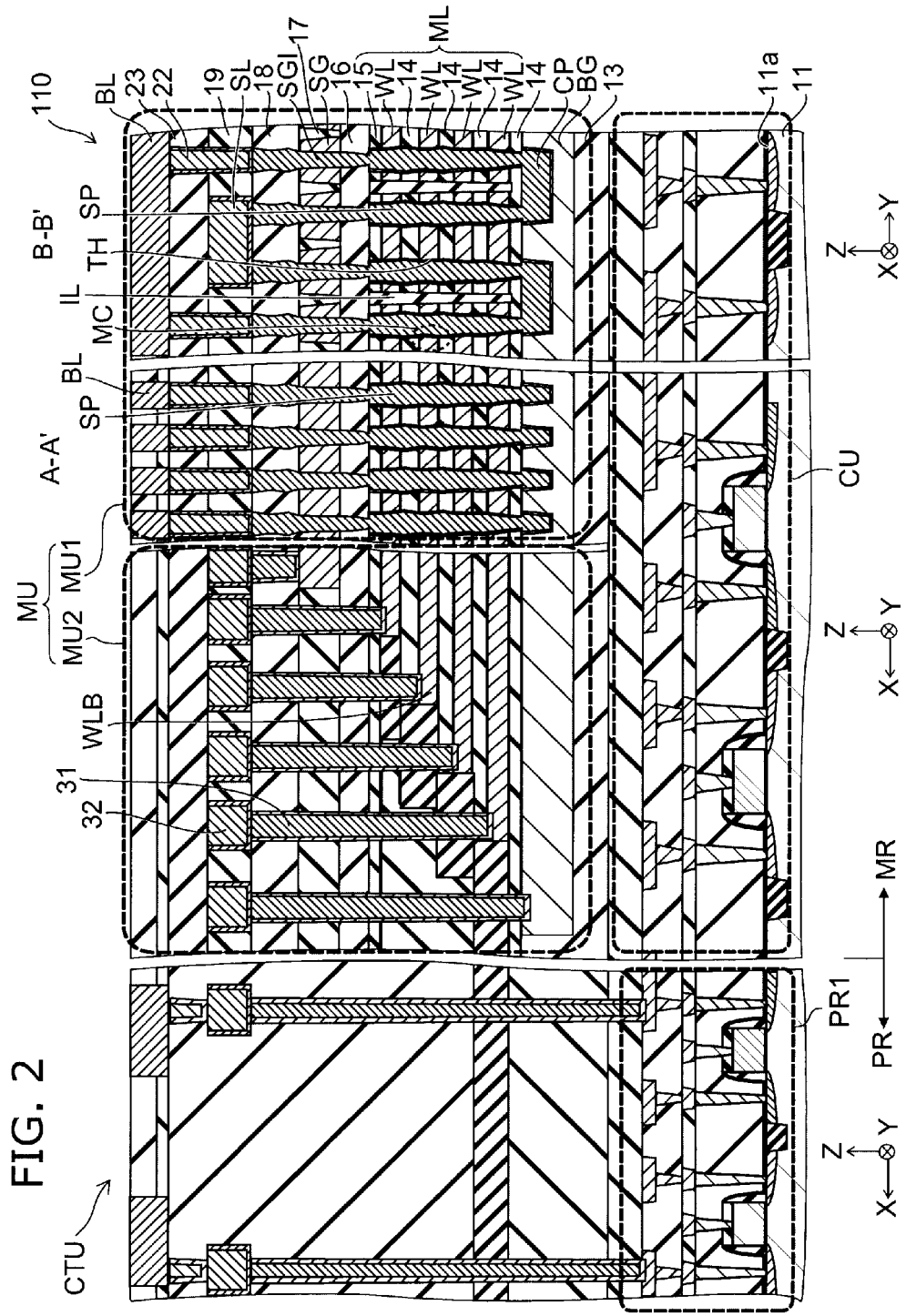
FIG. 2 is a schematic sectional view illustrating a general configuration of the nonvolatile semiconductor memory device according to the embodiment.

FIG. 2 is a schematic sectional view illustrating a general configuration of the nonvolatile semiconductor memory device according to the embodiment.

Figure 3:
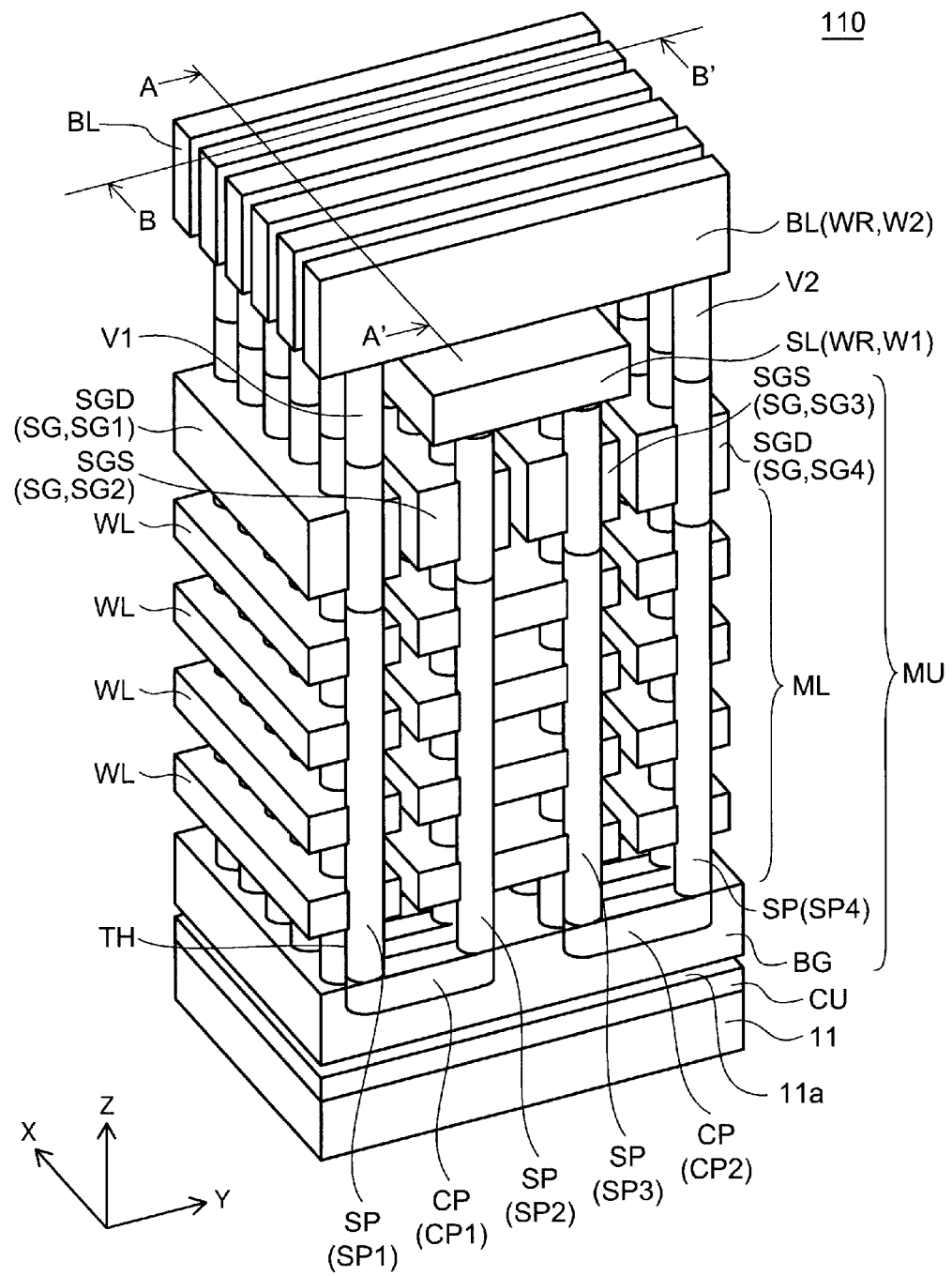
FIG. 3 is a schematic perspective view illustrating a configuration of the nonvolatile semiconductor memory device according to the embodiment.

FIG. 3 is a schematic perspective view illustrating a configuration of the nonvolatile semiconductor memory device according to the embodiment.

In FIG. 3, in order to make the diagram easier-to-see, only the conductive portion is shown and the insulating portion is not shown schematically.

Figure 4:
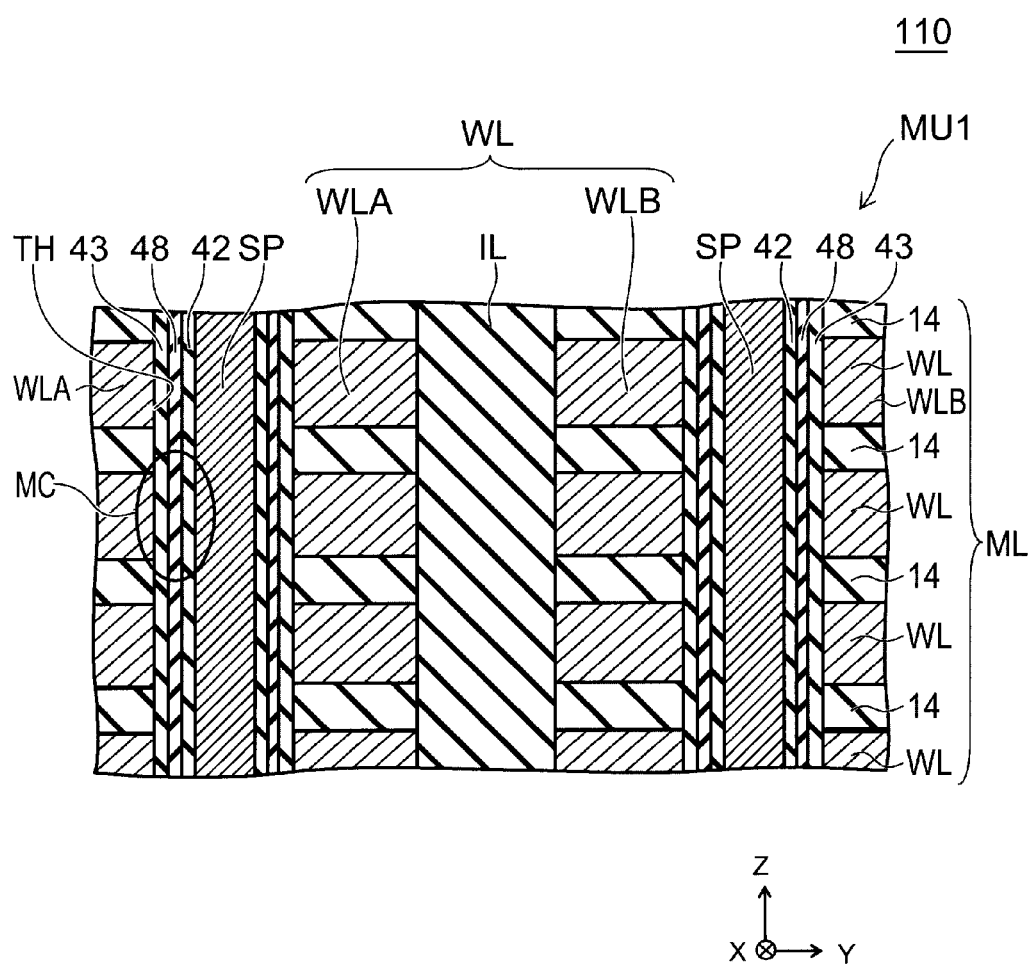
FIG. 4 is a schematic sectional view illustrating a configuration of part of the nonvolatile semiconductor memory device according to the embodiment.

FIG. 4 is a schematic sectional view illustrating a configuration of part of the nonvolatile semiconductor memory device according to the embodiment.

Figure 5:
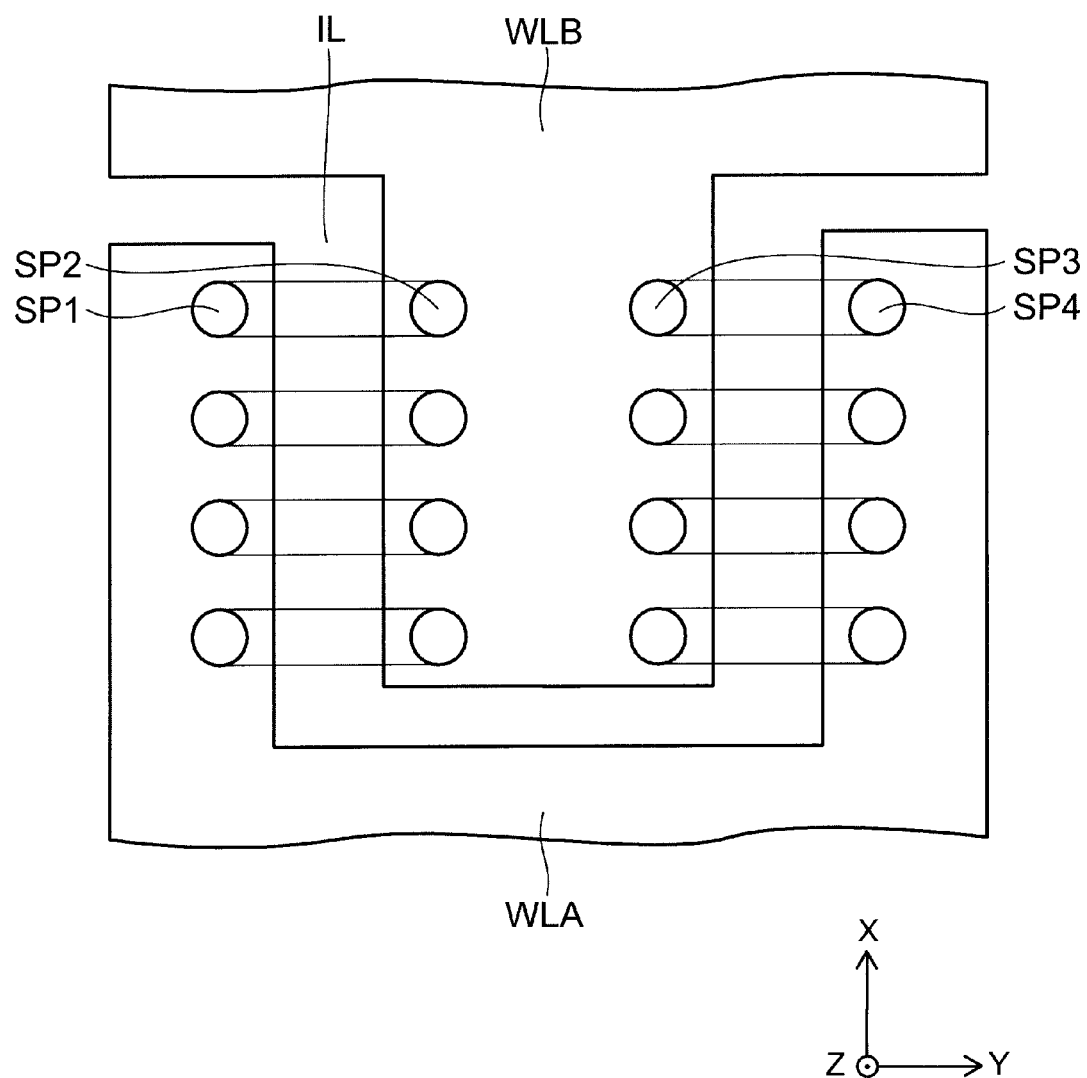
FIG. 5 is a schematic plan view illustrating a configuration of an electrode film of the nonvolatile semiconductor memory device according to the embodiment.

FIG. 5 is a schematic plan view illustrating a configuration of an electrode film of the nonvolatile semiconductor memory device according to the embodiment.

As shown in FIG. 1, the nonvolatile semiconductor memory device 110 according to an embodiment includes a memory unit MU and a control unit CTU. As shown in FIG. 4, the memory unit MU has a charge storage film 48 and has a plurality of memory cell transistors Tr connected in series. A threshold value of the memory cell transistor Tr is set according to charges stored in the memory region corresponding to the memory cell transistor Tr in the charge storage film 48.

One of the plurality of memory cell transistors Tr is used as an adjusting transistor, to be described later. The adjusting transistor is provided between the memory cell transistor (target transistor) Tr in which rewrite of the threshold value is performed and the memory cell transistor (non-target transistor) Tr in which rewrite of the threshold value is not performed.

That is, the nonvolatile semiconductor memory device 110 has at least the three memory cell transistors Tr. Then, one of the at least three memory cell transistors Tr is used as the adjusting transistor. Further, at least one of the remaining memory cell transistors Tr is a target transistor and at least one thereof is a non-target transistor.

The control unit CTU performs control so as to set a threshold value for adjustment to the adjusting transistor when rewriting the threshold value of part of the memory cell transistors Tr of the plurality of memory cell transistors Tr connected in series.

Here, when the threshold value of part of the memory cell transistors Tr is rewritten, the threshold value of the memory cell transistor Tr in which the rewrite is not performed varies relatively. The threshold value for adjustment is a value used to adjust an amount corresponding to the relative variations in the threshold value.

The control operation of the control unit CTU is described later.

The nonvolatile semiconductor memory device 110 according to the embodiment is, for example, a three-dimensional stacked type flash memory. Using FIG. 2 to FIG. 5, an outline of a configuration of the nonvolatile semiconductor memory device 110 is explained.

As shown in FIG. 2, the nonvolatile semiconductor memory device 110 includes the memory unit MU and the control unit CTU. These memory unit MU and control unit CTU are provided on a major surface 11a of a semiconductor substrate 11 including, for example, single crystal silicon. However, the control unit CTU may be provided on another substrate different from the substrate on which the memory unit MU is provided. Hereinafter, explanation is given on the assumption that the memory unit MU and the control unit CTU are provided on the same substrate (semiconductor substrate 11).

In the semiconductor substrate 11, for example, a memory array region MR in which a memory cell MC is provided and a peripheral region PR provided, for example, on the periphery of the memory array region MR are set. In the peripheral region PR, various peripheral region circuits PR1 are provided on the semiconductor substrate 11.

In the memory array region MR, for example, a circuit unit CU is provided on the semiconductor substrate 11 and on the circuit unit CU, the memory unit MU is provided. The circuit unit CU is provided according to the necessity and may be omitted. Between the circuit unit CU and the memory unit MU, an interlayer insulating layer 13 including, for example, silicon oxide is provided.

At least part of the control unit CTU may be provided, for example, in at least one of the peripheral region circuit PR1 and the circuit unit CU described above.

The memory unit MU has a matrix memory cell unit MU1 having a plurality of the memory cell transistors Tr and a connection unit MU2 that connects the interconnect of the matrix memory cell unit MU1.

FIG. 3 illustrates a configuration of the matrix memory cell unit MU1.

That is, in FIG. 2, as the matrix memory cell unit MU1, part of an A-A' section in FIG. 3 and part of a B-B' section in FIG. 3 are illustrated.

As shown in FIG. 2 and FIG. 3, in the matrix memory cell unit MU1, a stacked structure body ML is provided on the major surface 11a of the semiconductor substrate 11. The stacked structure body ML has a plurality of electrode films WL and a plurality of interelectrode insulating layers 14 which are stacked alternately in a direction vertical to the major surface 11a.

Here, in the specification of the application, for the sake of convenience of explanation, an XYZ orthogonal coordinate system is introduced. In this coordinate system, a direction vertical to the major surface 11a of the semiconductor substrate 11 is assumed to be a Z-axis direction. One direction in the plane in parallel with the major surface 11a is assumed to be a Y-axis direction. A direction vertical to the Z axis and the Y axis is assumed to be an X-axis direction.

The stacking direction of the electrode films WL and the interelectrode insulating layers 14 in the stacked structure body ML is the Z-axis direction. That is, the electrode film WL and the interelectrode insulating layer 14 are provided in parallel with the major surface 11a.

FIG. 4 illustrates a configuration of the matrix memory cell unit MU1 and corresponds to, for example, part of the B-B' line section in FIG. 3.

As shown in FIG. 3 and FIG. 4, the memory unit MU of the nonvolatile semiconductor memory device 110 has the stacked structure body ML, a semiconductor pillar SP (first semiconductor pillar SP1), which is a semiconductor part penetrating through the stacked structure body ML in the Z-axis direction, the charge storage film 48, an inside insulating layer 42, an outside insulating layer 43, and interconnect WR.

The charge storage film 48 is provided between each of the electrode films WL and the semiconductor pillar SP. The inside insulating layer 42 is provided between the charge storage film 48 and the semiconductor pillar SP. The outside insulating layer 43 is provided between each of the electrode films WL and the charge storage film 48. The interconnect WR is electrically connected to one end of the semiconductor pillar SP.

That is, on the wall face inside a through hole TH penetrating through the stacked structure body ML in the Z-axis direction, the outside insulating layer 43, the charge storage film 48, and the inside insulating layer 42 are formed in this order and the semiconductor pillar SP is formed inside thereof.

The memory cell MC is provided at the intersection portion of the electrode film WL of the stacked structure body ML and the semiconductor pillar SP. That is, at the portion where the electrode film WL and the semiconductor pillar SP intersect, the memory cell transistors Tr having the charge storage film 48 are provided in the form of a three-dimensional matrix and by storing charges in the charge storage film 48, each of the memory cell transistors Tr functions as the memory cell MC that stores data. Consequently, the position of the electrode film WL in the charge storage film 48 of the memory cell MC functions as a memory region and a plurality of memory regions is provided along the charge storage film 48.

The inside insulating layer 42 functions as a tunnel insulating layer in the memory cell transistor of the memory cell MC. On the other hand, the outside insulating layer 43 functions as a block insulating layer in the memory cell transistor of the memory cell MC. The interelectrode insulating layer 14 functions as an interlayer insulating layer that insulates the electrode films WL from each other.

For the electrode film WL, an arbitrary conductive material may be used and for example, amorphous silicon or polysilicon given conductivity by introducing impurities may be used and metals and alloys may also be used. To the electrode film WL, a predetermined electric signal is applied and the electrode film WL functions as a word line of the nonvolatile semiconductor memory device 110.

For the interelectrode insulating layer 14, the inside insulating layer 42, and the outside insulating layer 43, for example, a silicon oxide film may be used. The interelectrode insulating layer 14, the inside insulating layer 42, and the outside insulating layer 43 may be a single layer film or a stacked film.

For the charge storage film 48, for example, a silicon nitride film may be used and the charge storage film 48 functions as a portion that stores information by storing or discharging charges by an electric field applied between the semiconductor pillar SP and the electrode film WL. The charge storage film 48 may be a single layer film or a stacked film.

As will be described later, for the interelectrode insulating layer 14, the inside insulating layer 42, the charge storage film 48, and the outside insulating layer 43, an arbitrary material may be used, not limited to the materials illustrated above.

In FIG. 2 and FIG. 3, the case is illustrated where the stacked structure body ML has the electrode films WL in four layers, but the number of the electrode films WL provided in the stacked structure body ML is arbitrary. Hereinafter, a case is explained where the electrode films WL are provided in four layers.

The one semiconductor pillar SP constitutes an I-shaped NAND string (memory string). It may also be possible to constitute a U-shaped NAND string by connecting one-end sides of the two semiconductor pillars SP. In the specific example, the two semiconductor pillars SP are connected by a connection part CP (connection part semiconductor layer). That is, the memory unit MU further has a second semiconductor pillar SP2 (the semiconductor pillar SP) and a first connection part CP1 (the connection part CP).

The second semiconductor pillar SP2 neighbors the first semiconductor pillar SP1 (the semiconductor pillar SP), for example, in the Y-axis direction and penetrates through the stacked structure body ML in the Z-axis direction. The first connection part CP1 electrically connects the first semiconductor pillar SP1 and the second semiconductor pillar SP2 on the same side (on the side of the semiconductor substrate 11) in the Z-axis direction. For the first connection part CP1, the same material as that of the first and second semiconductor pillars SP1 and SP2 is used.

On the major surface 11a of the semiconductor substrate 11, a back gate BG (connection part conductive layer) is provided via the interlayer insulating layer 13. Then, a trench (a trench CTR to be described later) is provided so as to connect the first semiconductor pillar SP1 and the second semiconductor pillar SP2 to the back gate BG and inside the trench, the outside insulating layer 43, the charge storage film 48, and the inside insulating layer 42 are formed and the connection part CP is embedded inside thereof. The formation of the outside insulating layer 43, the charge storage film 48, the inside insulating layer 42, and the connection part CP in the trench is performed collectively at the same time as the formation of the outside insulating layer 43, the charge storage film 48, the inside insulating layer 42, and the semiconductor pillar SP in the through hole TH. In this manner, the back gate BG is provided around the connection part CP.

Hence, the U-shaped semiconductor pillar is formed by the first semiconductor pillar SP1, the second semiconductor pillar SP2, and the connection part CP, thus forming a U-shaped NAND string.

Although the connection part CP has a function to electrically connect the first semiconductor pillar SP1 and the second semiconductor pillar SP2, the connection part CP may be also utilized as one memory cell, thus increasing the number of memory bits. Hereinafter, a case is explained where the connection part CP electrically connects the first semiconductor pillar SP1 and the second semiconductor pillar SP2 and is not used as a memory part.

As shown in FIG. 2 and FIG. 3, the end of the first semiconductor pillar SP1, which is opposite to the first connection part CP1, is connected to a bit line BL (second interconnect W2) and the end of the second semiconductor pillar SP2, which is opposite to the first connection part CP1, is connected to a source line SL (first interconnect W1). The semiconductor pillar SP and the bit line BL are connected by a via V1 and a via V2. The interconnect WR includes the first interconnect W1 and the second interconnect W2.

In the specific example, the bit line BL extends in the Y-axis direction and the source line SL extends in the X-axis direction.

Then, between the stacked structure body ML and the bit line BL, a drain side selection gate electrode SGD (first selection gate electrode SG1, that is, selection gate electrode SG) is provided in opposition to the first semiconductor pillar SP1 and a source side selection gate electrode SGS (second selection gate electrode SG2, that is, the selection gate electrode SG) is provided in opposition to the second semiconductor pillar SP2. Thereby, it is possible to write or read desired data to or from any of the memory cells MC of any of the semiconductor pillars SP.

For the selection gate electrode SG, an arbitrary conductive material may be used and for example, polysilicon or amorphous silicon may be used. In the specific example, the selection gate electrode SG is divided in the Y-axis direction and has a band-like shape extending in the X-axis direction.

As shown in FIG. 2, at the uppermost part of the stacked structure body ML (the farthest side from the semiconductor substrate 11), an interlayer insulating layer 15 is provided. Then, on the stacked structure body ML, an interlayer insulating layer 16 is provided and the selection gate electrode SG is provided thereon and between the selection gate electrodes SG, an interlayer insulating layer 17 is provided. Then, a through hole is provided in the selection gate electrode SG, a selection gate insulating layer SGI of the selection gate transistor is provided on the inside face thereof, and a semiconductor is embedded inside thereof. This semiconductor is connected to the semiconductor pillar SP. That is, it can also be said that the memory unit MU further has the selection gate electrode SG stacked on the stacked structure body ML in the Z-axis direction and caused to penetrate through the semiconductor pillar SP on the side of the interconnect WR (at least one of the source line SL and the bit line BL).

Then, on the interlayer insulating layer 17, an interlayer insulating layer 18 is provided and the source line SL and a via 22 (the vias V1, V2) are provided thereon and an interlayer insulating layer 19 is provided around the source line SL. Then, on the source line SL, an interlayer insulating layer 23 is provided and the bit line BL is provided thereon. The bit line BL has a band-like shape along the Y axis.

For the interlayer insulating layers 15, 16, 17, 18, 19, and 23 and the selection gate insulating layer SGI, for example, silicon oxide may be used.

Here, it is assumed that when all the semiconductor pillars or an arbitrary semiconductor pillar is referred to as to a plurality of semiconductor pillars provided in the nonvolatile semiconductor memory device 110, it is referred to as "semiconductor pillar SP" and when a specific semiconductor pillar is referred to when explaining a relationship between the semiconductor pillars, it is referred to as "k-th semiconductor pillar SPk" (k is an arbitrary integer not less than 1).

As shown in FIG. 5, in the electrode film WL, electrode films corresponding to the semiconductor pillars SP(4j+1) and SP(4j+4), when k is (4j+1) and (4j+4) where j is an integer not less than 0, are connected commonly and formed into an electrode film WLA and electrode films corresponding to the semiconductor pillars SP(4j+2) and (4j+3), when k is (4j+2) and (4j+3), are connected commonly and formed into an electrode film WLB. That is, the electrode film WL has a shape in which the electrode film WLA and the electrode film WLB are combined in the form of a comb tooth in opposition to each other in the X-axis direction.

As shown in FIG. 4 and FIG. 5, the electrode film WL is divided by an insulating layer IL and thereby the electrode film WL is divided into a first region (the electrode film WLA) and a second region (the electrode film WLB).

Then, as the connection part MU2 illustrated in FIG. 2, the electrode film WLB is connected to a interconnect layer 32 by a via plug 31 at one end in the X-axis direction and electrically connected to a drive circuit provided, for example, in the semiconductor substrate 11. Then, similarly, at the other end in the X-axis direction, the electrode film WLA is connected to a interconnect layer by a via plug and electrically connected to the drive circuit.

Next, each embodiment is explained. It is possible for one memory cell to record n-value (n is an integer not less than 2) information (threshold value information). In order to make explanation easier-to-understand, in the following explanation, a case where n=4, that is, four-value information is recorded is explained as an example. The four-value information is two-bit data "11", "10", "01" and "00". Threshold values of the memory cell transistors corresponding to the four-value information are represented as A, B, C and D. When erasing the information of the memory cell, a threshold value of the memory cell transistor corresponding to the information to be erased is represented as E. Further, threshold values of the memory cell transistors corresponding to information other than the four-value information and information to be erased are represented as symbols other than A, B, C, D and E.

First Embodiment

FIG. 6 is a diagram for explaining a first embodiment.

FIGS. 6A to 6C show transition of information accompanying the operation of the control unit CTU at one rewrite timing. FIGS. 6A to 6C each show an equivalent circuit of a NAND string (hereinafter, simply referred to as "string") of the nonvolatile semiconductor memory device 110 according to the first embodiment. One string includes a plurality of the memory cell transistors Tr connected in series between the source side selection gate electrode SGS and the drain side selection gate electrode SGD. In the following explanation, the plurality of memory cell transistors provided between the source side selection gate electrode SGS and the drain side selection gate electrode SGD is referred to as Tr1, Tr2, ... in order and these memory cell transistors are generally referred to as Tr. In FIG. 6, as an example, 12 memory cell transistors Tr, that is, Tr1 to Tr12 are provided.

The symbol attached to each memory cell transistor Tr shows an example of the threshold value set to the memory cell transistor Tr.

In the first embodiment, in one string, two groups GR1, GR2 each having a plurality of the memory cell transistors Tr are set and the two memory cell transistors Tr6 and Tr7 arranged between the groups GR1 and GR2 are utilized as an adjusting transistor Tr-AJ and a reference transistor Tr-REF, respectively.

Here, it is assumed that the group arranged on the side of the source side selection gate electrode SGS (hereinafter, simply referred to as "source side") with respect to the adjusting transistor Tr-AJ is referred to as the group GR1 and the group arranged on the side of the drain side selection gate electrode SGD (hereinafter, simply referred to as "drain side") is referred to as the group GR2. The group GR1 and the group GR2 include at least one memory cell transistor Tr, respectively. The adjusting transistor Tr-AJ is connected next to the drain side of the group GR1. The group GR2 is connected to the opposite side of the group GR1 with respect to the adjusting transistor Tr-AJ. The reference transistor Tr-REF is provided between the adjusting transistor Tr-AJ and the group GR2.

FIG. 6A illustrates a state where a threshold value corresponding to information is set to each memory cell transistor Tr. The control unit CTU performs, as an example, the operation to rewrite the threshold values set to the memory cell transistors Tr1 to Tr5 of the group GR1. Here, it is assumed that any of the threshold values A to D is set to the memory cell transistors Tr1 to Tr5 and a threshold value Y is set to the adjusting transistor Tr-AJ.

Before rewriting the threshold values, the control unit CTU grasps the threshold value of the reference transistor Tr-REF in advance. To the reference transistor Tr-REF, a threshold value corresponding to fixed threshold value information is set in advance. In the example shown in FIG. 6A, the threshold value A is set. For example, the control unit CTU reads and stores the threshold value A of the reference transistor Tr-REF. It may also be possible to read the threshold value A of the reference transistor Tr-REF each time before rewriting the threshold values or once. In the case where the operation of setting a threshold value for adjustment to the adjusting transistor Tr-AJ has been already done, it is not necessary to read of the threshold value A of the reference transistor Tr-REF.

The control unit CTU holds the threshold value A of the reference transistor Tr-REF in a time period from before to after rewriting the threshold values of the memory cell transistors Tr1 to Tr5.

Next, the control unit CTU rewrites the threshold values set to the memory cell transistors Tr1 to Tr5 of the group GR1 and the threshold value of the adjusting transistor Tr-AJ to the threshold value for erasure E. FIG. 6B illustrates a state where the memory cell transistors Tr1 to Tr5 of the group GR1 and the adjusting transistor Tr-AJ are set to the threshold value for erasure E.

Here, in the case where the memory cell transistors Tr1 to Tr5 of the group GR1 and the adjusting transistor Tr-AJ are set to the threshold value for erasure E as shown in FIG. 6B, relative variations occur in the threshold values of the reference transistor Tr-REF and the memory cell transistors Tr8 to Tr12 arranged on the side nearer to the drain side than to the adjusting transistor Tr-AJ. This is because the threshold values set in advance of the memory cell transistors Tr1 to Tr5 of the group GR1 and the adjusting transistor Tr-AJ (see FIG.

6A) are rewritten to the threshold value for erasure E, and therefore, the threshold values on the source side as viewed from the group GR2 are changed and a change occurs in the parasitic resistance on the source side with respect to the group GR2.

That is, in one string, if the threshold value of the memory cell transistor Tr is rewritten partially, a change occurs in the parasitic resistance on the source side of the memory cell transistor Tr the threshold value of which is rewritten. Due to this, the threshold value of the memory cell transistor Tr on the side nearer to the drain side than the memory cell transistor Tr the threshold value of which is rewritten changes relatively as a result.

Consequently, in this state as it is, it is not possible to correctly read the threshold value of the memory cell transistor Tr on the side nearer to the drain side than the memory cell transistor Tr the threshold value of which is rewritten.

Next, as shown in FIG. 6C, the control unit CTU writes new threshold values to the memory cell transistors Tr1 to Tr5 of the group GR1. Any of the threshold values A to D is set to the memory cell transistors Tr1 to Tr5. Due to this, the threshold values of the memory cell transistors Tr1 to Tr5 of the group GR1 are rewritten as a result.

However, in this state as it is, there is a possibility that a difference occurs between the parasitic resistance before the threshold values of the memory cell transistors Tr1 to Tr5 of the group GR1 are rewritten (see FIG. 6A) and the parasitic resistance after the rewrite, and a relative change occurs in the threshold values of the memory cell transistors Tr8 to Tr12 of the group GR2.

Hence, the control unit CTU sets a threshold value for adjustment to the adjusting transistor Tr-AJ and adjusts an amount corresponding to the relative change in the threshold values that occurs in the memory cell transistors Tr8 to Tr12 of the group GR2.

Specifically, stepwise writing is performed so that the threshold value of the adjusting transistor Tr-AJ changes in a stepwise manner.

FIG. 7 is a schematic view for explaining the stepwise writing to the adjusting transistor.

Figures 7A, 7B:
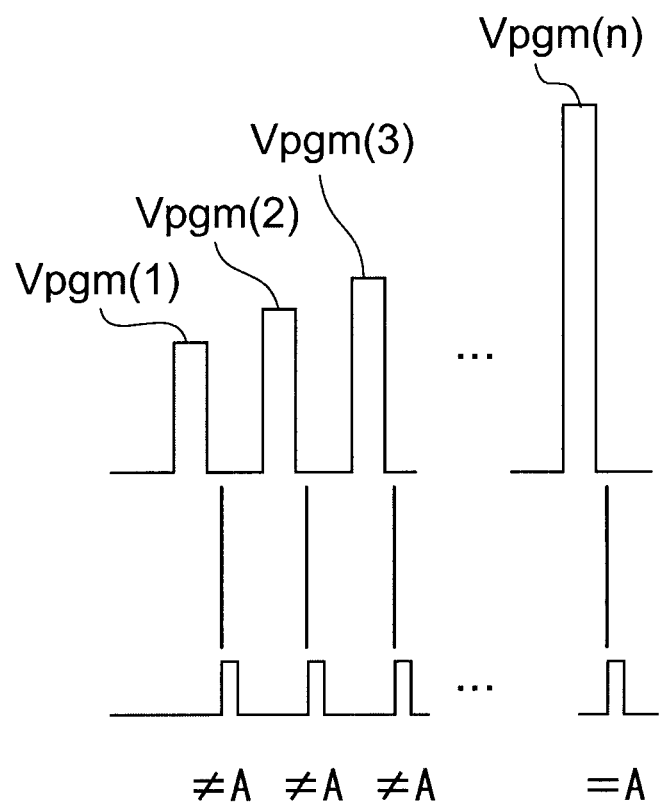
FIG. 7A to 7B are schematic views for explaining the stepwise writing to the adjusting transistor.

FIG. 7A schematically shows a change in a write voltage Vpgm to be applied to the adjusting transistor Tr-AJ. FIG. 7B schematically shows a read timing of the reference transistor Tr-REF.

First, the control unit CTU applies a write voltage Vpgm (1) to the adjusting transistor Tr-AJ. By this application, the threshold value of the adjusting transistor Tr-AJ changes. After applying the write voltage Vpgm (1), the control unit CTU reads the threshold value of the reference transistor Tr-REF.

The control unit CTU determines whether or not the threshold value read here is the threshold value A stored in advance of the reference transistor Tr-REF. When it is the threshold value A, the writing to the adjusting transistor Tr-AJ is completed.

On the other hand, when it is not the threshold value A, the control unit CTU applies a write voltage Vpgm (2) to the adjusting transistor Tr-AJ. The magnitude of the write voltage Vpgm (2) is set so that there is a fixed difference from the magnitude of the write voltage Vpgm (1).

After applying the write voltage Vpgm (2), the control unit CTU reads the threshold value of the reference transistor Tr-REF. The control unit CTU determines whether or not the threshold value read here is the threshold value A stored in advance of the reference transistor Tr-REF. When it is the threshold value A, the writing to the adjusting transistor Tr-AJ is completed. On the other hand, when it is not the threshold value A, the control unit CTU applies a write voltage Vpgm (3) to the adjusting transistor Tr-AJ.

In this manner, the control unit CTU repeats application of a voltage that changes in a stepwise manner to the adjusting transistor Tr-AJ and reading of the threshold value of the reference transistor Tr-REF until the read threshold value reaches the threshold value A stored in advance of the reference transistor Tr-REF. When the read threshold value reaches the threshold value A, the threshold value set to the adjusting transistor Tr-AJ is the threshold value for adjustment (for example, Z).

When the threshold value for adjustment Z is set to the adjusting transistor Tr-AJ, the whole parasitic resistance of the memory cell transistors Tr1 to Tr5 and Tr6 on the source side with respect to the group GR2 becomes the same as the parasitic resistance before the rewrite of the threshold values. Due to this, the amount corresponding to the relative change in the threshold values that occurs in the memory cell transistors Tr8 to Tr12 of the group GR2 on the side nearer to the drain side than the group GR1 is, for example, cancelled out. Consequently, even if the threshold values of the memory cell transistors Tr1 to Tr5 of the group GR1 are rewritten, it is made possible to read the n-value information from the memory cell transistors Tr8 to Tr12 of the group GR2 by the same threshold values as those before the rewrite.

In the embodiment, the reference transistor Tr-REF is arranged next to the adjusting transistor Tr-AJ, but it is not necessarily required to be arranged next thereto. That is, it is only required for the reference transistor Tr-REF to be arranged on the side nearer to the drain side than the adjusting transistor Tr-AJ. However, when the reference transistor Tr-REF is arranged next to the adjusting transistor Tr-AJ, the memory cell transistors Tr of the group GR2 are arranged successively, and therefore, the control of the application of a voltage to the memory cell transistor Tr by the control unit CTU is made easier.

Further, it is desirable to set the threshold value to be set to the reference transistor Tr-REF to the threshold value A, which is closest to the threshold value for erasure E, of the threshold values A to D corresponding to the n-value information. Accordingly, it is made possible to distinguish the threshold value A of the reference transistor Tr-REF from the threshold value for erasure E in a brief time at the time of the stepwise writing when setting the threshold value for adjustment to the adjusting transistor Tr-AJ.

In the embodiment, the example is explained, in which the memory cell transistors Tr1 to Tr5 of the group GR1 are rewritten. When rewriting the memory cell transistors Tr8 to Tr12 of the group GR2, the threshold values of the memory cell transistors Tr1 to Tr5 of the group GR1, the adjusting transistor Tr-AJ, and the reference transistor Tr-REF arranged on the side nearer to the source side than the group GR2 do not change, and therefore, the parasitic resistance does not change and rewrite can be performed in this state as it is.

Figure 8A:
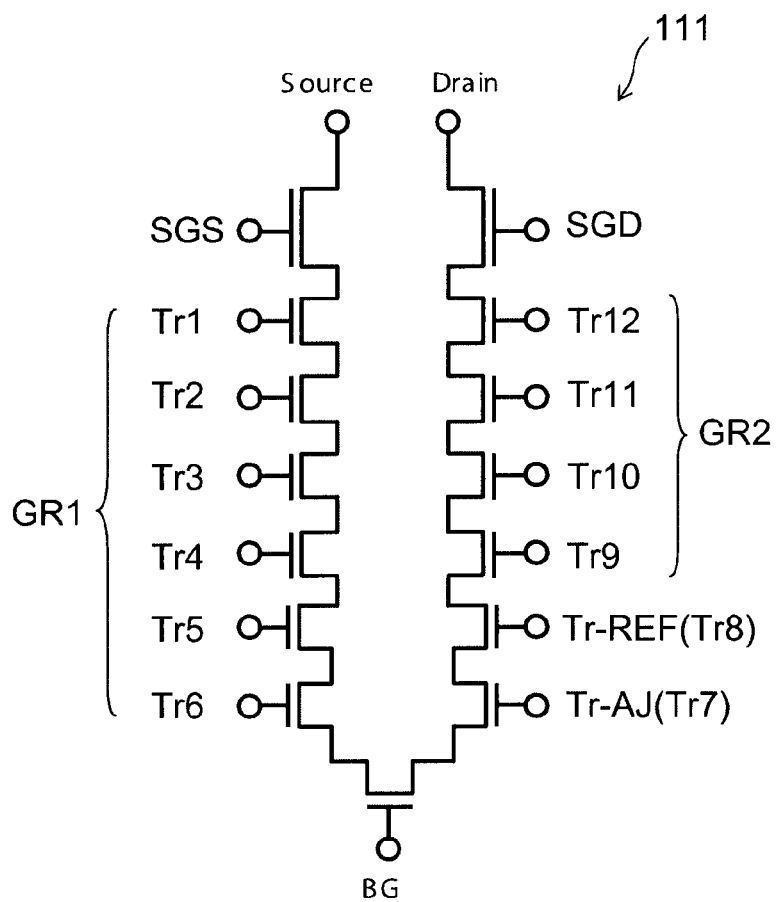
FIG. 8A to 8B are diagrams for explaining an application example to the nonvolatile semiconductor memory device comprising a back gate in a string.
Figure 8B:
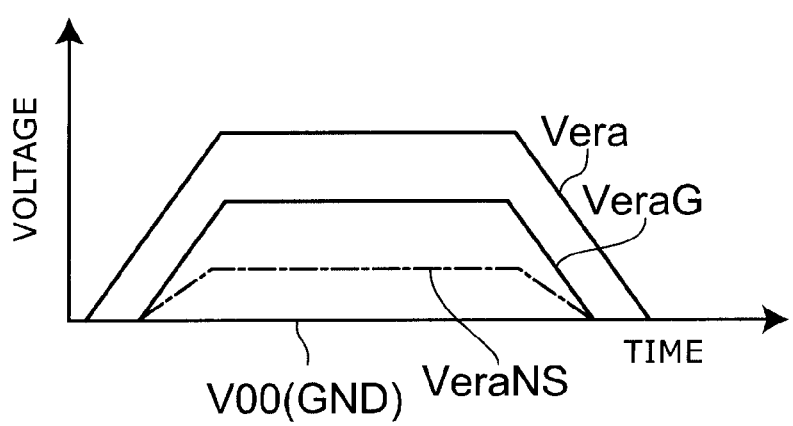

FIG. 8 is a diagram for explaining an application example to a nonvolatile semiconductor memory device comprising a back gate in a string.

In a nonvolatile semiconductor memory device 111, the back gate BG is provided in the string. In the example shown in FIG. 8, the memory cell transistors Tr1 to Tr6 are included in the group GR1 and the memory cell transistors Tr9 to Tr12 are included in the group GR2. Then, the memory cell transistor Tr7 is utilized as the adjusting transistor Tr-AJ and the memory cell transistor Tr8 as the reference transistor Tr-REF.

The control unit CTU reads and stores the threshold value of the reference transistor Tr-REF before rewriting the threshold values of the memory cell transistors Tr1 to Tr6 of the group GR1.

Next, the control unit CTU sets a threshold value for erasure to the memory cell transistors Tr1 to Tr6 of the group GR1 and the adjusting transistor Tr-AL When setting the threshold value for erasure to part of the memory cell transistors Tr of the string, the control unit CTU applies an erasure voltage Vera to the interconnect WR. The control unit CTU applies an erasure time selection gate voltage VeraG, which is a voltage of the positive polarity and the maximum value of which is lower than that of the erasure voltage Vera, to the source side selection gate electrode SGS and the drain side selection gate electrode SGD delayed slightly from the start of application of the erasure voltage Vera. It may also be possible to start application of the erasure time selection gate voltage VeraG at the same time as that of the erasure voltage Vera.

Further, the control unit CTU applies an intermediate voltage VeraNS, which is a voltage of the positive polarity and the maximum value of which is lower than that of the erasure time selection gate voltage VeraG, to the back gate BG delayed slightly from the start of application of the erasure time selection gate voltage VeraG. It may also be possible to start application of the intermediate voltage VeraNS at the same time as that of the erasure time selection gate voltage VeraG. Furthermore, the control unit CTU applies a reference potential V00 (for example, ground potential GND) to the electrode films WL of the memory cell transistors Tr1 to Tr6 and the adjusting transistor Tr-AJ to be erased.

On the other hand, the control unit CTU applies the intermediate voltage VeraNS to the electrode films WL of the memory cell transistors Tr9 to Tr12 of the group GR2 and the reference transistor Tr-REF not to be erased. Due to this, the threshold value for erasure is set only to the memory cell transistors Tr1 to Tr6 of the group GR1 and the adjusting transistor Tr-AJ to be erased and the threshold values of the memory cell transistors Tr9 to Tr12 of the group GR2 and the reference transistor Tr-REF not to be erased are maintained.

Next, the control unit CTU sets new threshold values to the memory cell transistors Tr1 to Tr6 of the group GR1 to be rewritten. After that, the control unit CTU sets the threshold value for adjustment to the adjusting transistor Tr-AJ. As described earlier, the setting of the threshold value for adjustment is done by repeating the stepwise writing to the adjusting transistor Tr-AJ until the threshold value of the reference transistor Tr-REF can be read as the threshold value stored in advance.

Due to this, the parasitic resistance of the memory cell transistors Tr1 to Tr6 of the group GR1 the threshold values of which are rewritten is the same as the parasitic resistance before the rewrite of the threshold values, and therefore, the amount corresponding to the relative change in the threshold values that occurs in the memory cell transistors Tr9 to Tr12 of the group GR2 on the side nearer to the drain side than the group GR1 is, for example, cancelled out. Hence, even if the threshold values of the memory cell transistors Tr1 to Tr6 of the group GR1 are rewritten, it is made possible to read the n-value information from the memory cell transistors Tr9 to Tr12 of the group GR2 by the same threshold values as those before the rewrite.

In the nonvolatile semiconductor memory device 111, the back gate BG has the same structure as that of the memory cell transistor Tr, and therefore, it may also be possible to utilize the back gate BG as the reference transistor Tr-REF. In this case, the memory cell transistor Tr on the side nearer to the source side than the back gate BG (for example, the memory cell transistors Tr6) is used as the adjusting transistor Tr-AJ.

Figure 9:
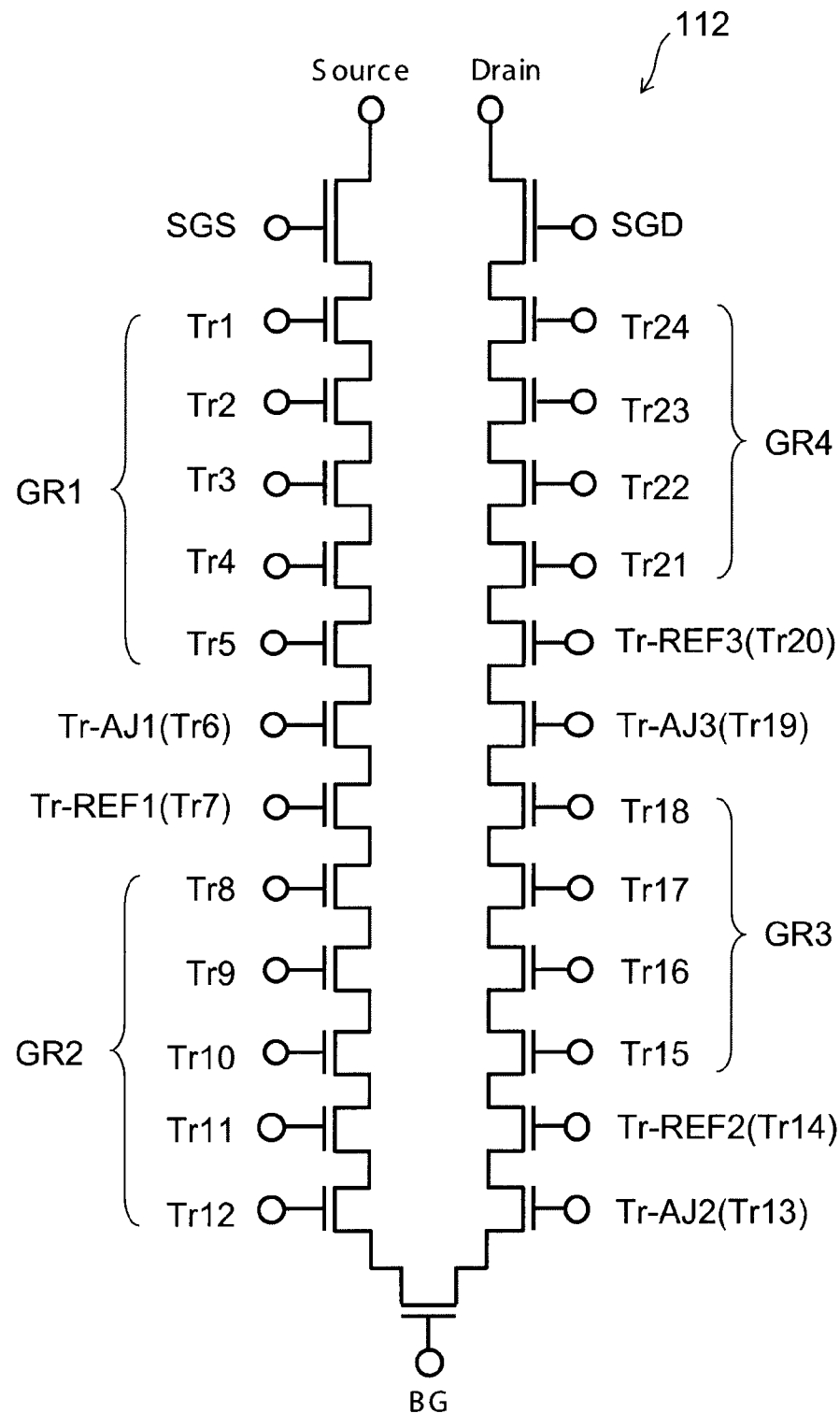
FIG. 9 is a diagram for explaining an example of another division of the string.

FIG. 9 is a diagram for explaining an example of another division of a string.

In the embodiment explained above, the example is shown, in which one string is divided into two, that is, the groups GR1 and GR2, but it may also be possible to divide a string into three or more as shown in FIG. 9.

In a nonvolatile semiconductor memory device 112 illustrated in FIG. 9, to one string, 24 memory cell transistors Tr1 to Tr24 are connected in series. When one string is divided into n (n is an integer not less than 2), (n−1) sets of the adjusting transistor Tr-AJ and the reference transistor Tr-REF are set.

In the example shown in FIG. 9, one string is divided into four. Consequently, three sets of the adjusting transistor Tr-AJ and the reference transistor Tr-REF are set. As an example, the memory cell transistors Tr1 to Tr5 are included in the group GR1, the memory cell transistors Tr8 to Tr12 in the group GR2, the memory cell transistors Tr15 to Tr18 in the group GR3, and the memory cell transistors Tr21 to Tr24 in the group GR4.

Further, the memory cell transistors Tr6 and Tr7 between the group GR1 and the group GR2 are utilized as an adjusting transistor Tr-AJ1 and a reference transistor Tr-REF1.

The memory cell transistors Tr13 and Tr14 between the group GR2 and the group GR3 are utilized as an adjusting transistor Tr-AJ2 and a reference transistor Tr-REF2.

The memory cell transistors Tr19 and Tr20 between the group GR3 and the group GR4 are utilized as an adjusting transistor Tr-AJ3 and a reference transistor Tr-REF3.

Even if a string is divided into three or more as described above, it is possible to rewrite the threshold value of the memory cell transistor Tr for each of the groups GR1 to GR4 by the same operation as that of the division into two.

The rewrite operation is explained below. Here, the threshold value of the memory cell transistor Tr of the group is simply referred to also as "group threshold value".

When the group GR1 is rewritten, the control unit CTU regards the group GR1 as one target group and the groups GR2 to GR4, which are arranged on the side nearer to the drain side than the group GR1 and are not to be rewritten, as one non-target group. Then, the control unit CTU performs the same operation as that of the division into two on the target group and the non-target group. In this case, after temporarily setting the threshold value of the group GR1 to the threshold value for erasure, the control unit CTU rewrites the threshold value. On the other hand, the threshold values of the non-target groups GR2 to GR4 are held. After that, the threshold value for adjustment is set to the adjusting transistor Tr-AJ1 arranged between the group GR1 and the group GR2. At this time, the value is set so that, for example, the amount corresponding to the variations in the threshold value of the reference transistor Tr-REF1 is cancelled out. Due to this, it is made possible to read the n-value information by the same threshold value as that before the rewrite of the group GR1 as to the memory cell transistors Tr of the groups GR2 to GR4 on the side nearer to the drain side than the adjusting transistor Tr-AJ1.

When the group GR2 is rewritten, the control unit CTU regards the group GR2 as one target group and the groups GR3 and GR4 which are arranged on the side nearer to the drain side than the group GR2 and are not to be rewritten as one non-target group. Then, the control unit CTU performs the same operation as that of the division into two on the target group and the non-target group. In this case, after temporarily setting the threshold value of the group GR2 to the threshold value for erasure, the control unit CTU rewrites the threshold value. On the other hand, the threshold values of the non-target groups GR3 and GR4 and group GR1 are held. After that, the threshold value for adjustment is set to the adjusting transistor Tr-AJ2 arranged between the group GR2 and the group GR3. At this time, the value is set so that, for example, the amount corresponding to the variations in the threshold value of the reference transistor Tr-REF2 is cancelled out. Due to this, it is made possible to read the n-value information by the same threshold value as that before the rewrite of the group GR2 as to the memory cell transistors Tr of the groups GR3 and GR4 on the side nearer to the drain side than the adjusting transistor Tr-AJ2. Because the group GR1 is arranged on the side nearer to the source side than the group GR2, the threshold value of the group GR1 is not affected by the rewrite of the threshold value of the group GR2 and it is possible to perform reading.

When the group GR3 is rewritten, the control unit CTU performs the same operation as that of the division into two on the group GR3 and the group GR4 which is arranged on the side nearer to the drain side than the group GR3 and is not to be rewritten. In this case, after temporarily setting the threshold value of the group GR3 to the threshold value for erasure, the control unit CTU rewrites the threshold value. On the other hand, the threshold values of the group GR1, the groups GR2 and GR4 not to be rewritten are held. After that, the threshold value for adjustment is set to the adjusting transistor Tr-AJ3 arranged between the group GR3 and the group GR4. At this time, the value is set so that, for example, the amount corresponding to the variations in the threshold value of the reference transistor Tr-REF3 is cancelled out. Due to this, it is made possible to read the n-value information by the same threshold value as that before the rewrite of the group GR3 as to the memory cell transistors Tr of the group GR4 on the side nearer to the drain side than the adjusting transistor Tr-AJ3. Because the groups GR1 and GR2 are arranged on the side nearer to the source side than the group GR3, the threshold values of the groups GR1 and GR2 are not affected by the rewrite of the threshold value of the group GR3 and it is possible to perform reading.

When the group GR4 is rewritten, the groups GR1 to GR3 on the side nearer to the source side than the group GR4 are not affected by the rewrite of the threshold value of the group GR4. Consequently, it is possible to independently erase and rewrite the group GR4.

When two or more groups are rewritten, the operation is as follows.

First, when the groups to be rewritten are successive, these groups are regarded as one target group and groups which are arranged on the side nearer to the drain side than this target group and are not to be rewritten (a plurality of successive groups is included) as a non-target group. Then, the control unit CTU performs the same operation as that of the division into two on the target group and the non-target group.

For example, when the groups GR1 and GR2 shown in FIG. 9 are rewritten, the control unit CTU regards the groups GR1 and GR2 as the target group and the groups GR3 and GR4 as the non-target group and performs the same operation as that of the division into two. At this time, the memory cell transistor Tr13 arranged between the target group and the non-target group, that is, between the group GR2 and the group GR3 is utilized as the adjusting transistor Tr-AJ and the transistor Tr14 is utilized as the reference transistor Tr-REF.

Next, when the target groups are not successive, the control unit CTU performs the same operation as that of the division into two on one target group and a non-target group next to the drain side of the target group. At this time, the control unit CTU sequentially performs the same operation as that of the division into two from the source side to the drain side.

For example, when the groups GR1 and GR3 shown in FIG. 9 are rewritten, the control unit CTU first performs the same operation as that of the division into two on the group GR1, the target group, and the group GR2, the non-target group next to the drain side of the group GR1. Due to this, the threshold value of the group GR1 is rewritten and the threshold value for adjustment is set to the adjusting transistor Tr-AJ1.

Next, the control unit CTU performs the same operation as that of the division into two on the group GR3, the target group on the side nearer to the drain side than the group GR2, the non-target group, and the group GR4, the non-target group, next to the drain side of the group GR3. Due to this, the threshold value of the group GR3 is rewritten and the threshold value for adjustment is set to the adjusting transistor Tr-AJ3. When setting the threshold value for adjustment to the adjusting transistor Tr-AJ3, the threshold values of the group GR1 and the adjusting transistor Tr-AJ1 on the side nearer to the source side than this are already determined, and therefore, the threshold value for adjustment of the adjusting transistor Tr-AJ3 is also determined by the already determined threshold values as a result.

Because the adjusting transistor Tr-AJ and the reference transistor Tr-REF are provided as in the nonvolatile semiconductor memory devices 110, 111 and 112 according to the first embodiment, it is made possible to rewrite the threshold value for each group into which one string is divided. Further, because a fixed threshold value is set to the reference transistor Tr-REF, it is made possible to quickly and stably set the threshold value for adjustment to the adjusting transistor Tr-AJ.

Second Embodiment

FIG. 10 is a diagram for explaining a second embodiment.

FIGS. 10A to 10C show transition of information accompanying the operation of the control unit CTU at one rewrite timing. Each diagram in FIGS. 10A to 10C shows an equivalent circuit of a string of a nonvolatile semiconductor memory device 120 according to the second embodiment.

In the second embodiment, the two groups GR1, GR2 are set in one string and the memory cell transistor Tr6 arranged between the groups GR1 and GR2 is utilized as the adjusting transistor Tr-AJ.

Further, in the second embodiment, one of the memory cell transistors Tr on the side nearer to the drain side than the adjusting transistor Tr-AJ is used also as the reference transistor Tr-REF. In the example shown in FIG. 10, the memory cell transistor Tr7 included in the group GR2 is used also as the reference transistor Tr-REF.

FIG. 10A illustrates a state where a threshold value corresponding to information is set to each memory cell transistor Tr. As an example, the control unit CTU performs the operation to rewrite the threshold values set to the memory cell transistors Tr1 to Tr5 of the group GR1. Here, it is assumed that any of the threshold values A to D is set to the memory cell transistors Tr1 to Tr5 of the group GR1 and the threshold value Y is set to the adjusting transistor Tr-AJ.

Before rewriting the threshold values, the control unit CTU grasps in advance the threshold value of the memory cell transistor Tr7 used also as the reference transistor Tr-REF. To the memory cell transistor Tr7, a threshold value corresponding to the n-value is set as in the other memory cell transistors Tr. In the example shown in FIG. 10A, the threshold value C is set. For example, the control unit CTU reads and stores the threshold value C of the memory cell transistor Tr7. The control unit CTU reads the threshold value C of the memory cell transistor Tr7 each time before rewriting the threshold value. This is because the memory cell transistor Tr7 is utilized also as the normal memory cell transistor Tr, and therefore, it is necessary for the control unit CTU to grasp which threshold value is set to the memory cell transistor Tr7 before rewriting the threshold value.

Next, the control unit CTU rewrites the threshold values set to the memory cell transistors Tr1 to Tr5 of the group GR1 and the threshold value of the adjusting transistor Tr-AJ to the threshold value for erasure E. FIG. 10B illustrates a state where the memory cell transistors Tr1 to Tr5 of the group GR1 and the adjusting transistor Tr-AJ are set to the threshold value for erasure E.

Next, as shown in FIG. 10C, the control unit CTU writes new threshold values to the memory cell transistors Tr1 to Tr5 of the group GR1. To the memory cell transistors Tr1 to Tr5, any of the threshold values A to D is set. Due to this, the threshold values of the memory cell transistors Tr1 to Tr5 of the group GR1 are rewritten as a result.

Here, in the state where the threshold values of the memory cell transistors Tr1 to Tr5 of the group GR1 are rewritten, there is a possibility that a difference is produced between the parasitic resistance before the rewrite of the threshold values (see FIG. 10A) and the parasitic resistance after the rewrite and a relative change occurs in the threshold values of the memory cell transistors Tr7 to Tr12 of the group GR2. In other words, this is because the threshold values on the source side as viewed from the group GR2 is changed, and therefore, a change occurs in the parasitic resistance on the source side with respect to the group GR2.

Then, the control unit CTU sets the threshold value for adjustment to the adjusting transistor Tr-AJ to adjust the amount corresponding to the relative change in the threshold values that occurs in the memory cell transistors Tr7 to Tr12 of the group GR2. The writing of the threshold value to the adjusting transistor Tr-AJ is the same as that in the first embodiment. That is, the control unit CTU repeats the application of the voltage that changes in a stepwise manner to the adjusting transistor Tr-AJ and the reading of the threshold value of the reference transistor Tr-REF (the memory cell transistor Tr7) until the read threshold value becomes the threshold value C stored in advance of the reference transistor Tr-REF (the memory cell transistor Tr7). When the read threshold value becomes C, the threshold value set to the adjusting transistor Tr-AJ becomes the threshold value for adjustment (for example, X).

When the threshold value for adjustment X is set to the adjusting transistor Tr-AJ, the whole parasitic resistance of the memory cell transistors Tr1 to Tr5 and Tr6 on the source side with respect to the group GR2 becomes equivalent to the parasitic resistance before the rewrite of the threshold values. Due to this, the amount corresponding to the relative change in the threshold values that occurs in the memory cell transistors Tr7 to Tr12 of the group GR2 on the side nearer to the drain side than the group GR1 is, for example, cancelled out. Consequently, even if the threshold values of the memory cell transistors Tr1 to Tr5 of the group GR1 are rewritten, it is made possible to read the n-value information from the memory cell transistors Tr7 to Tr12 of the group GR2 by the same threshold values as those before the rewrite.

Figure 11A:
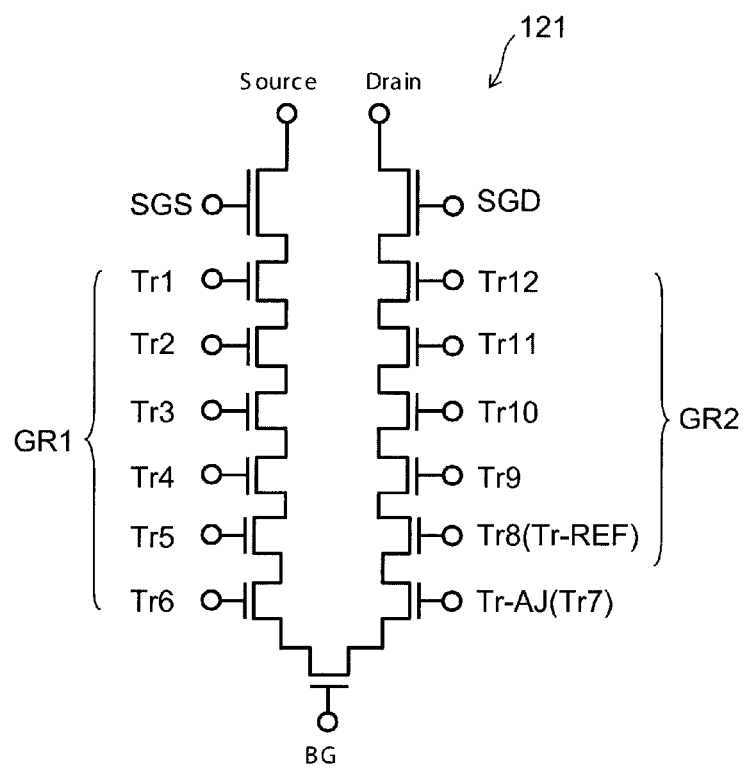
FIG. 11A to 11B are diagrams for explaining an application example to the nonvolatile semiconductor memory device comprising a back gate in the string.
Figure 11B:
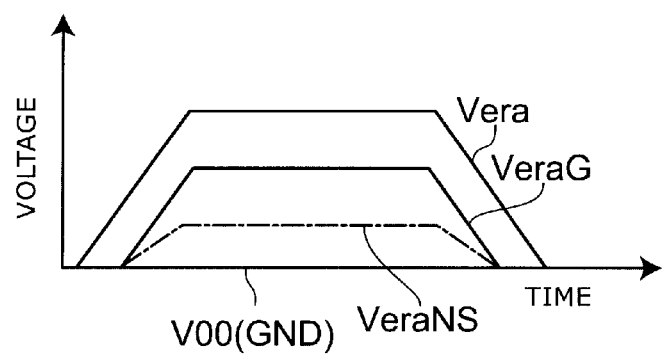

FIG. 11 is a diagram for explaining an application example to a nonvolatile semiconductor memory device comprising a back gate in a string.

In a nonvolatile semiconductor memory device 121, the back gate BG is provided in the string. In the example shown in FIG. 11, the memory cell transistors Tr1 to Tr6 are included in the group GR1 and the memory cell transistors Tr8 to Tr12 are included in the group GR2. Then, the memory cell transistor Tr7 is utilized as the adjusting transistor Tr-AJ.

The control unit CTU reads and stores the threshold value of the memory cell transistor Tr8 of the group GR2 in order to utilize it as the threshold value of the reference transistor Tr-REF before rewriting the threshold values of the memory cell transistors Tr1 to Tr6 of the group GR1.

Next, the control unit CTU sets a threshold value for erasure to the memory cell transistors Tr1 to Tr6 of the group GR1 and the adjusting transistor Tr-AJ. When setting the threshold value for erasure to part of the memory cell transistors Tr of the string, the control unit CTU applies the erasure voltage Vera to the interconnect WR. The control unit CTU applies the erasure time selection gate voltage VeraG, which is a voltage of the positive polarity and the maximum value of which is lower than that of the erasure voltage Vera, to the source side selection gate electrode SGS and the drain side selection gate electrode SGD delayed slightly from the start of application of the erasure voltage Vera. It may also be possible to start application of the erasure time selection gate voltage VeraG at the same time as that of the erasure voltage Vera.

Further, the control unit CTU applies the intermediate voltage VeraNS, which is a voltage of the positive polarity and the maximum value of which is lower than that of the erasure time selection gate voltage VeraG, to the back gate BG delayed slightly from the start of application of the erasure time selection gate voltage VeraG. It may also be possible to start application of the intermediate voltage VeraNS at the same time as that of the erasure time selection gate voltage VeraG. Furthermore, the control unit CTU applies the reference potential V00 (for example, the ground potential GND) to the electrode films WL of the memory cell transistors Tr1 to Tr6 and the adjusting transistor Tr-AJ to be erased.

On the other hand, the control unit CTU applies the intermediate voltage VeraNS to the electrode films WL of the memory cell transistors Tr8 to Tr12 of the group GR2 not to be erased. Due to this, the threshold value for erasure is set only to the memory cell transistors Tr1 to Tr6 of the group GR1 and the adjusting transistor Tr-AJ to be erased and the threshold values of the memory cell transistors Tr8 to Tr12 of the group GR2 not to be erased are maintained.

Next, the control unit CTU sets new threshold values to the memory cell transistors Tr1 to Tr6 of the group GR1 to be rewritten. After that, the control unit CTU sets the threshold value for adjustment to the adjusting transistor Tr-AJ. As described earlier, the setting of the threshold value for adjustment is done by repeating the stepwise writing to the adjusting transistor Tr-AJ until the threshold value of the reference transistor Tr-REF (the memory cell transistor Tr7) can be read as the threshold value stored in advance.

Due to this, the parasitic resistance of the memory cell transistors Tr1 to Tr6 of the group GR1 the threshold values of which are rewritten becomes equivalent to the parasitic resistance before the rewrite of the threshold values, and therefore, the amount corresponding to the relative change in the threshold values that occurs in the memory cell transistors Tr8 to Tr12 of the group GR2 on the side nearer to the drain side than the group GR1 is, for example, cancelled out. Because of this, even if the threshold values of the memory cell transistors Tr1 to Tr6 of the group GR1 are rewritten, it is made possible to read the n-value information from the memory cell transistors Tr8 to Tr12 of the group GR2 by the same threshold values as those before the rewrite.

In the nonvolatile semiconductor memory device 121, the back gate BG has the same structure as that of the memory cell transistor Tr, and therefore, it may also be possible to utilize the back gate BG as the reference transistor Tr-REF. In this case, the memory cell transistor Tr on the side nearer to the source side than the back gate BG (for example, the memory cell transistors Tr6) is used as the adjusting transistor Tr-AJ.

Figure 12:
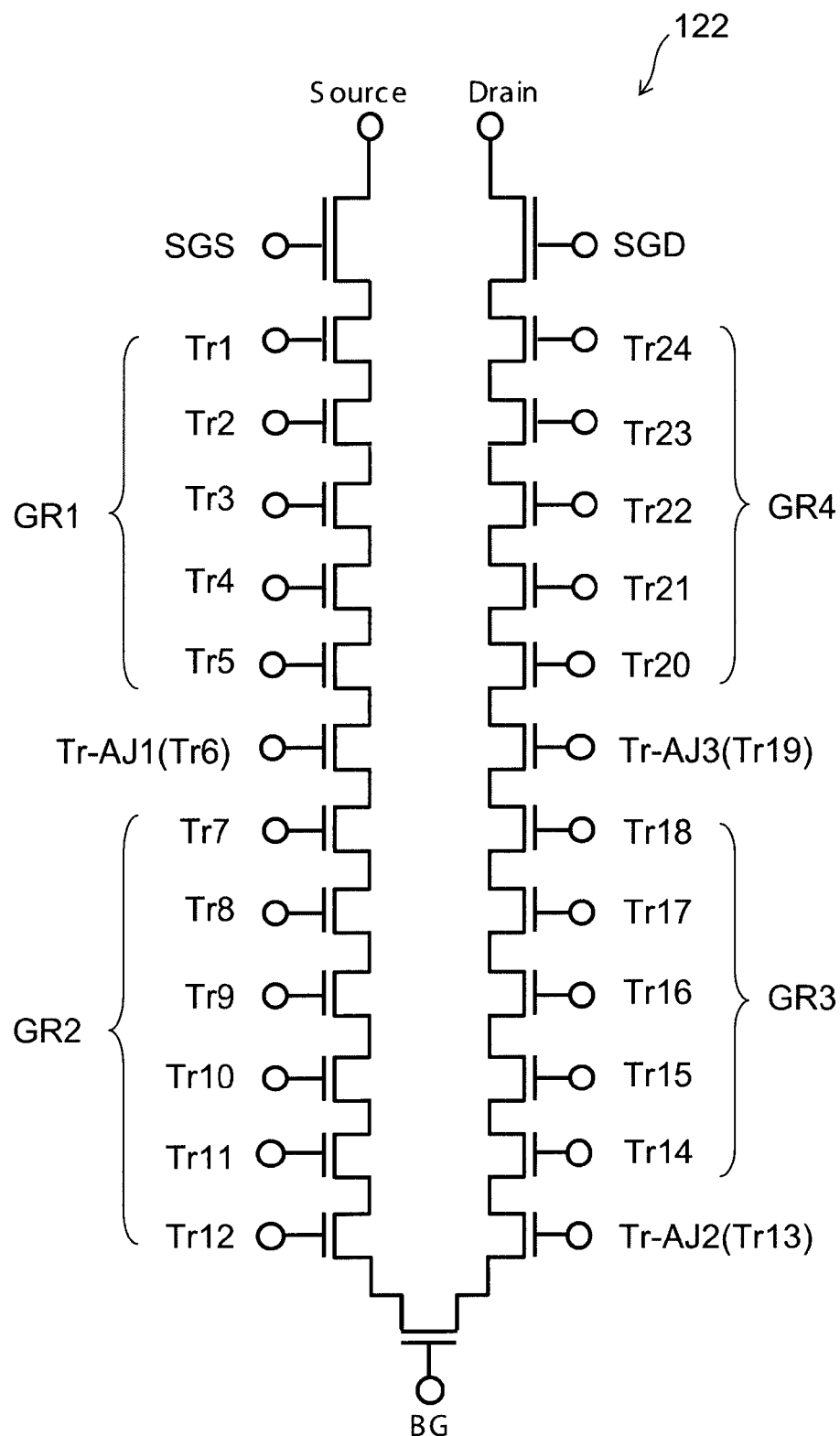
FIG. 12 is a diagram for explaining an example of another division of the string.

FIG. 12 is a diagram for explaining an example of another division of a string.

In the embodiment explained above, the example is shown, in which one string is divided into two, that is, the groups GR1 and GR2, however, it may also be possible to divide a string into three or more as shown in FIG. 12.

In a nonvolatile semiconductor memory device 122 illustrated in FIG. 12, to one string, 24 memory cell transistors Tr1 to Tr24 are connected in series. When one string is divided into n (n is an integer not less than 2), (n−1) adjusting transistors Tr-AJ are set.

In the example shown in FIG. 12, one string is divided into four. Consequently, the three adjusting transistors Tr-AJ are set. As an example, the memory cell transistors Tr1 to Tr5 are included in the group GR1, the memory cell transistors Tr8 to Tr12 in the group GR2, the memory cell transistors Tr15 to Tr18 in the group GR3, and the memory cell transistors Tr21 to Tr24 in the group GR4.

Further, the memory cell transistor Tr6 between the group GR1 and the group GR2 is utilized as the adjusting transistor Tr-AJ1. The memory cell transistor Tr13 between the group GR2 and the group GR3 is utilized as the adjusting transistor Tr-AJ2. The memory cell transistor Tr19 between the group GR3 and the group GR4 is utilized as the adjusting transistor Tr-AJ3.

Even if a string is divided into three or more as described above, it is possible to rewrite the threshold value of the memory cell transistor Tr for each of the groups GR1 to GR4 by the same operation as that of the division into two. The rewrite operation is the same as that of the nonvolatile semiconductor memory device 112 shown in FIG. 9. In this case, in the nonvolatile semiconductor memory device 122, as the reference transistors Tr-REF, the memory cell transistors (for example, the memory cell transistors Tr7, Tr14, and Tr20) on the side nearer to the drain side than the adjusting transistors Tr-AJ1, Tr-AJ2, and Tr-AJ3, respectively, may be utilized.

In the nonvolatile semiconductor memory devices 120, 121 and 122 according to the second embodiment, as in the nonvolatile semiconductor memory devices 110, 111 and 112 according to the first embodiment, it is made possible to rewrite the threshold value for each group into which one string is divided. Further, the reference transistor Tr-REF is used also as the memory cell transistor Tr, and therefore, it is not necessary to prepare separately as the reference transistor Tr-REF and it is made possible to prevent reduction in the memory capacity.

In both the first embodiment and the second embodiment described above, the operation at one write timing is illustrated. Consequently, there may be a case where a group that is not to be rewritten at one write timing becomes a group to be rewritten at another write timing.

For example, there may be a case where the group GR1 is to be rewritten at one write timing and the group GR2 is to be rewritten at the next timing. In this case, the rewrite operation in the case of the division into two is performed between the group GR1 and the group GR2 at one timing and then the threshold value for adjustment is set to the adjusting transistor Tr-AJ1, and the rewrite operation in the case of the division into two is performed between the group GR2 and the group GR3 at the next timing, and then the threshold value for adjustment is set to the adjusting transistor Tr-AJ2.

Figure 13:
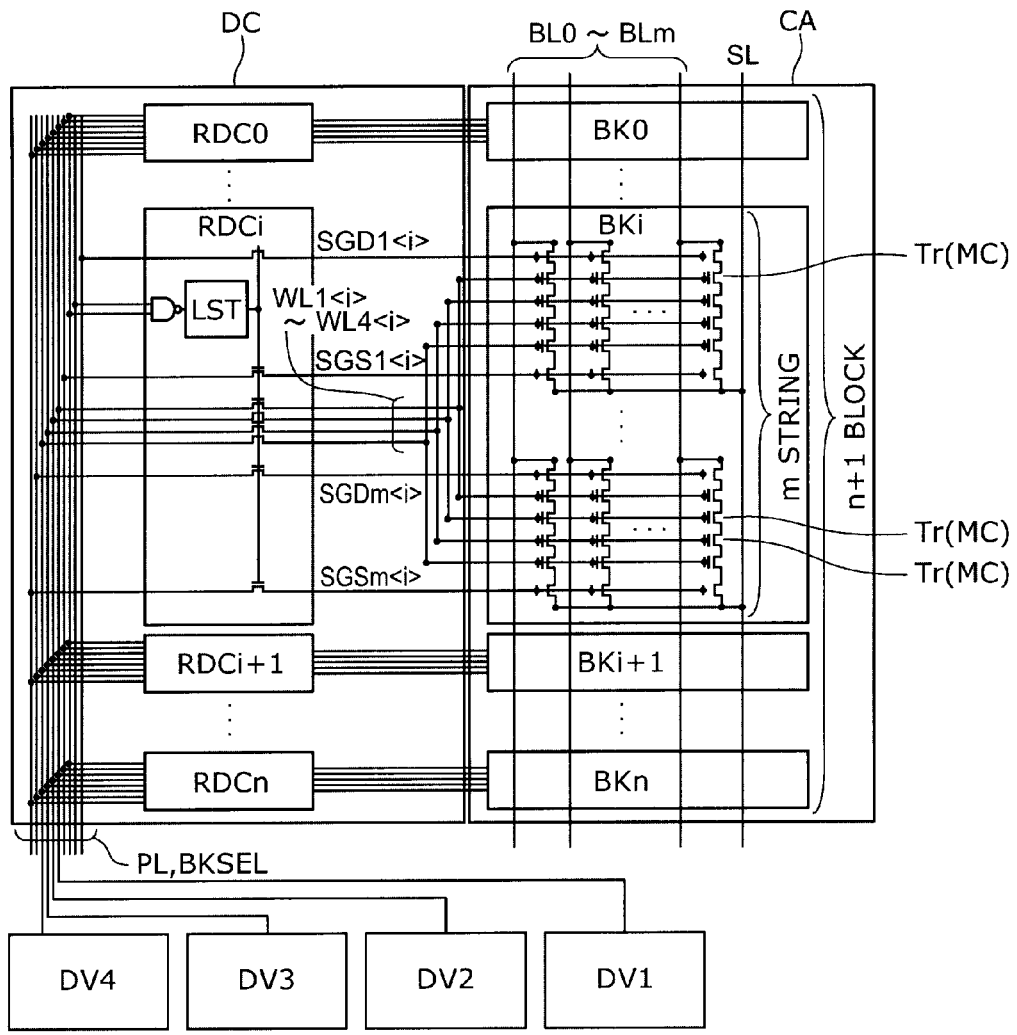
FIG. 13 is a circuit diagram for explaining a drive circuit configuration of the nonvolatile semiconductor memory device according to the embodiment.

FIG. 13 is a circuit diagram for explaining a drive circuit configuration of the nonvolatile semiconductor memory device according to the embodiment. That is, the nonvolatile semiconductor memory device includes a cell array CA and a decoder DC. In the cell array CA, n blocks (n is an integer not less than 1 in FIG. 13 and its explanation) having m strings (m is an integer not less than 1 in FIG. 13 and its explanation) are provided. One string is provided with a plurality of memory cells MC and is in a state where the memory cell transistors Tr of each memory cell MC are connected in series. The memory cell transistor Tr is designed so that its threshold value varies according to the information set to the memory cell MC.

The decoder DC includes a row decoder RDC. The row decoder RDC includes a level sifter LST. The n row decoders RDC are provided in each block of the cell array. That is, blocks BK0, BK1, . . . , BKi, . . . , BKn are provided in correspondence with row decoders RDC0, RDC1, . . . , RDCi, . . . , RDCn, respectively.

The row decoder RDCi connected to the block BKi gives signals SGD1<i> to SGDm<i> to the drain side selection gate electrode SGD and signals SGS1<i> to SGSm<i> to the source side selection gate electrode SGS of the m strings of the block BKi. Further, the row decoder RDCi gives a signal to the electrode film WL of the block BKi in units of layers. In the example shown in FIG. 13, because of the electrode films WL in four layers, signals WL1<i> to WL4<i> are given. The row decoders RDC other than the row decoder RDCi have the same configuration and give the corresponding blocks the same signals as those described above.

To each of the blocks BK0 to BKn of the cell array CA, bit lines BL0 to BLm are connected commonly to the m strings of each blocks BK0 to BKn and to each blocks BK0 to BKn, the common source line SL is connected.

The control of signals to be sent to the bit lines BL0 to BLm and the source line SL and the control of the row decoder RDC are performed by driver circuits DV1 to DV4. The driver circuits DV1 to DV4 are circuits that control each of signals WL1<i> to WL4<i> in each of the blocks BK0 to BKn. The driver circuits DV1 to DV4 are circuits that control a power supply line PL and a block select signal line BLSEL. The driver circuit DV1 controls the signal WL1<i> of each of the blocks BK0 to BKn, the driver circuit DV2 controls the signal WL2<i> of each of the blocks BK0 to BKn, the driver circuit DV3 controls the signal WL3<i> of each of the blocks BK0 to BKn, and the driver circuit DV4 controls the signal WL4<i> of each of the blocks BK0 to BKn. The signals output from the driver circuits DV1 to DV4 are sent to the signals WL1<i> to WL4<i> of each of the blocks BK0 to BKn via each of the row decoders RDC0 to RDCn.

The driver circuit may be provided within the same chip as that of the nonvolatile semiconductor memory device or may be provided outside the chip.

In the embodiment explained above, the nonvolatile semiconductor memory device comprising a U-shaped NAND string in which mainly two semiconductor pillars are connected by the connection part is taken as an example, but the invention may be applied to a nonvolatile semiconductor memory device that does not include the connection part but includes an I-shaped NAND string in which each semiconductor pillar is independent.

Further, the invention may also be applied to a planar-type nonvolatile semiconductor memory device having a MONOS structure in which, for example, a plurality of memory regions is provided in memory layers continuous in a planar manner and an electrode part is formed in the memory region via an insulating layer, in addition to a configuration in which a semiconductor pillar is caused to penetrate through a stacked structure body in which the electrode films WL and the interelectrode insulating layers 14 are stacked alternately.

In the nonvolatile semiconductor memory device according to the embodiment, for the interelectrode insulating layer 14, the inside insulating layer 42, and the outside insulating layer 43, any single layer film selected from a group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film including two or more selected from the group may be used.

For the charge storage film 48, any single layer film selected from a group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film including two or more selected from the group may be used.

In the specification of the application, "perpendicular" and "parallel" refer to not only strictly perpendicular and strictly parallel but also included, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components constituting nonvolatile semiconductor memory devices, such as semiconductor substrates, electrode films, insulating layers, insulating layers, stacked structure bodies, memory layers, charge storage layers, semiconductor pillars, word lines, bit lines, source lines, interconnects, memory cell transistors, selection gate transistors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

As explained above, according to the nonvolatile semiconductor memory devices 110, 111, 112, 120, 121 and 122 according to the embodiments, it is made possible to reduce the block size without an increase in the control unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for operating a nonvolatile semiconductor memory device, the nonvolatile semiconductor memory device including a memory unit having a memory string and a control unit controlling the memory unit, the memory string including a plurality of transistors connected in series and has a first group being part of the plurality of transistors, a first adjusting transistor connected next to the first group, and a second group including transistors connected to the side opposite the first group with respect to the first adjusting transistor, threshold values being set to the plurality of transistors, respectively, according to charges stored in a charge storage film, the method comprising:

rewriting the threshold values of the transistors of only the first group, and then performing control so as to set a first threshold value for adjustment to the first adjusting transistor to adjust an amount corresponding to relative variations in the threshold values of the transistors of the second group, the relative variations being caused by the rewrite of the threshold values of the transistors of the first group.

2. The method according to claim 1, wherein the second group includes a reference transistor, the control unit holds threshold value information of the reference transistor during the period from before to after rewriting the threshold values of the transistors of the first group, and the control unit adjusts an amount corresponding to relative variations in the threshold value of the reference transistor based on the threshold value information of the reference transistor.

3. The method according to claim 2, wherein the control unit performs control so as to set the first threshold value for adjustment so that the threshold value information of the reference transistor before rewriting the threshold values of the transistors of the first group agrees with the threshold value information of the reference transistor after rewriting the threshold values of the transistors of the first group.

4. The method according to claim 3, wherein the control unit changes the threshold value of the first adjusting transistor in a stepwise manner so that the threshold value information of the reference transistor before rewriting the threshold values of the transistors of the first group agrees with the threshold value information of the reference transistor after rewriting the threshold values of the transistors of the first group.

5. The method according to claim 4, wherein the control unit raises a voltage to be applied to the first adjusting transistor by a fixed difference in a stepwise manner.

6. The method according to claim 2, wherein a back gate is included in the plurality of transistors, and the control unit utilizes the back gate as the reference transistor.

7. The method according to claim 1, wherein the control unit performs control so as to set, after setting a threshold value for erasure to the transistors of the first group and the first adjusting transistor, any of threshold values corresponding to n-value (n is an integer not less than 2) information to the transistors of the first group, and then, set the first threshold value for adjustment to the first adjusting transistor.

8. The method according to claim 7, wherein the control unit changes the threshold value of the first adjusting transistor in a stepwise manner until it reaches from the threshold value for erasure to the first threshold value for adjustment.

9. The method according to claim 8, wherein
the control unit raises a voltage to be applied to the first adjusting transistor in a stepwise manner when changing the threshold value of the first adjusting transistor in a stepwise manner.

10. The method according to claim 9, wherein
the control unit raises the voltage to be applied to the first adjusting transistor by a fixed difference in a stepwise manner.

11. The method according to claim 1, wherein
the memory string further includes a reference transistor provided between the first adjusting transistor and the transistors of the second group,
the control unit holds the threshold value information of the reference transistor in a time period from before to after rewriting the threshold values of the transistors of the first group, and
the control unit adjusts an amount corresponding to relative variations in the threshold value of the reference transistor based on the threshold value information of the reference transistor.

12. The method according to claim 11, wherein
the control unit sets, when setting a threshold value for erasure and any of threshold values corresponding to n-value (n is an integer not less than 2) information as the threshold values of the transistors of the first group, the threshold value of the reference transistor to a threshold value closest to the threshold value for erasure, among the threshold values corresponding to the n-value information.

13. The method according to claim 1, wherein
the memory string further has a second adjusting transistor connected next to the side opposite the first adjusting transistor with respect to the second group and a third group including transistors connected to the side opposite the second group with respect to the second adjusting transistor,
the control unit rewrites the threshold values of the plurality of transistors included in the second group after setting the first threshold value for adjustment, and
the control unit performs control so as to set a second threshold value for adjustment to the second adjusting transistor to adjust an amount corresponding to relative variations in the threshold values of the transistors of the third group, the relative variations caused by the rewrite of the threshold values of the transistors of the second group.

14. The method according to claim 1, wherein
the plurality of transistors has:
a stacked structure body stacked electrode films and interelectrode insulating layers, alternately; and
a semiconductor pillar penetrating through the stacked structure body in a stacking direction, and
the charge storage film is provided between the semiconductor pillar and the electrode film.

15. The method according to claim 1, wherein
the plurality of transistors is connected in series between a source side selection gate electrode and a drain side selection source electrode.

16. The method according to claim 1, wherein
a reference transistor is included between the first adjusting transistor and the second group,
the control unit holds the threshold value information of the reference transistor in a time period from before to after rewriting the threshold values of the transistors of the first group, and
the control unit adjusts an amount corresponding to relative variations in the threshold value of the reference transistor based on the threshold value information of the reference transistor.

* * * * *